United States Patent
Park (10) Patent No.: US 7,883,958 B2
(45) Date of Patent: Feb. 8, 2011

(54) PHASE CHANGE MEMORY DEVICE HAVING A DIODE THAT HAS AN ENLARGED PN INTERFACIAL JUNCTION AND METHOD FOR MANUFACTURING THE SAME

(75) Inventor: Nam Kyun Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 124 days.

(21) Appl. No.: 12/433,260

(22) Filed: Apr. 30, 2009

(65) Prior Publication Data
US 2010/0108974 A1     May 6, 2010

(30) Foreign Application Priority Data
Nov. 6, 2008     (KR) ................. 10-2008-0110117

(51) Int. Cl.
*H01L 21/8234*     (2006.01)
(52) U.S. Cl. ............. 438/237; 438/258; 438/102; 257/476; 257/46
(58) Field of Classification Search ............. 438/237; 257/46
See application file for complete search history.

(56) References Cited

U.S. PATENT DOCUMENTS
7,803,679 B2 *   9/2010   Park et al. ................. 438/237

FOREIGN PATENT DOCUMENTS
KR   1020090003709 A    1/2009
KR   1020090015727 A    2/2009

* cited by examiner

*Primary Examiner*—Thanh V Pham
*Assistant Examiner*—Mark A Laurenzi, III
(74) *Attorney, Agent, or Firm*—Ladas & Parry LLP (57) ABSTRACT

A phase change memory device that has a diode with an enlarged, i.e., bulging, PN interfacial junction and a corresponding fabrication method are presented. The phase change memory device includes a semiconductor substrate, an insulation layer, a diode, and a phase change memory cell. The insulation layer is placed on the semiconductor substrate and has a contact hole which is wider in a middle portion than the lower and upper portions of the contact hole. The diode is formed within the contact hole and PN interfacial junction at the wider middle portion of the diode within the contact hole. The phase change memory cell is formed on top of the diode.

12 Claims, 6 Drawing Sheets

PHASE CHANGE MEMORY DEVICE HAVING A DIODE THAT HAS AN ENLARGED PN INTERFACIAL JUNCTION AND METHOD FOR MANUFACTURING THE SAME

CROSS-REFERENCE TO RELATED APPLICATIONS

The present application claims priority to Korean patent application number 10-2008-0110117 filed on Nov. 6, 2008, which is incorporated herein by reference in its entirety.

BACKGROUND OF THE INVENTION

The present invention relates to a phase change memory device and a method for manufacturing the same, and more particularly, to a phase change memory device having improved current drivability brought about by an increased area of a diode and a method for manufacturing the same.

Memory devices are generally divided into volatile RAMs (random access memory) which lose inputted information when power is interrupted and nonvolatile ROMs (read only memory) which can maintain the stored state of inputted information even when power is interrupted. As to volatile RAMs, a DRAM (dynamic RAM) and an SRAM (static RAM) can be mentioned. As to nonvolatile ROMs, a flash memory device such as an EEPROM (electrically erasable and programmable ROM) can be mentioned.

While DRAM are excellent memory devices, DRAMs require high charge storing capacity. To this end, since the surface area of DRAM electrodes must be relatively large, then it is difficult to accomplish a high level of integration. Further, since flash memory devices have two gates are stacked on each other, then a high operation voltage is required as compared to other comparable devices. According, flash memory devices require a separate booster circuit to generate the requisite voltage needed for the write and delete operations. Therefore, flash memory devices also make it is difficult to accomplish a high level of integration.

Under these circumstances, it is understandable that research has continued to actively develop a novel alternate memory devices which still have simple configurations and still are capable of accomplishing a high level of integration while retaining many of the desirable characteristics of the non-volatile memory devices. As an example, a phase change memory device has recently been disclosed in the art.

Phase change memory devices function by having a phase change occurs in a phase change layer interposed between a bottom electrode and a top electrode. This phase change layer transitions between an ordered crystalline state to an unordered amorphous crystalline state. This phase change transition can be driven by an electric current flowing between the bottom electrode and the top electrode. Information can be stored in these types of cells by exploiting the physical difference in the resistances between the crystalline and amorphous states. Specifically, in the phase change memory device the specific resistance of the phase change layer in the amorphous state is higher than the specific resistance of the phase change layer in the crystalline state. Accordingly, a phase change memory device can be developed that senses the current flowing through the phase change layer in a read state to determine whether information stored in a phase change memory cell has a logic value corresponding to '1' or '0'.

In order to manufacture a phase change memory device of 512 Mb or greater, a method of adopting vertical PN diodes as switching elements has been proposed. In the case of adopting the vertical PN diodes, advantages are provided in that a cell size can be decreased below 6 femtometers$^2$. Also, since the PN diodes have great dependency on the sectional area thereof, the current drivability of the phase change memory device changes in proportion to the area of the PN diodes.

However, as the area of the diodes decreases in conformity with the trend toward the high integration of semiconductor devices, the current drivability of the phase change memory device deteriorates in the conventional art, whereby the characteristics and the reliability of the devices in the conventional art degrade.

Hence, in order to increase the area of diodes, a method has been proposed, in which the CD (critical dimension) of contact holes for diodes is increased overall. Nevertheless, in this case, since the CD of the upper surfaces of the diodes formed in the contact holes increases, a bridge phenomenon is likely to occur between adjoining diodes.

SUMMARY OF THE INVENTION

Embodiments of the present invention are directed to a phase change memory device that realize an improved current drivability by having an increased diode area and a method for manufacturing the same.

In one aspect of the present invention, a phase change memory device comprises a semiconductor substrate; an insulation layer placed on the semiconductor substrate and having a contact hole which has a CD that is greater at a middle portion thereof than an upper portion and a lower portion thereof; a diode formed in the contact hole; and a phase change memory cell formed on the diode.

The phase change memory device further comprises a conductivity type impurity region formed in a surface of the semiconductor substrate in such a way as to contact the diode.

The insulation layer has a triple-layered structure of a first insulation layer, a second insulation layer, and a third insulation layer.

The second insulation layer comprises a layer which has an etch rate higher than the first insulation layer and the third insulation layer.

The first insulation layer and the third insulation layer comprise PE-TEOS layers, and the second insulation layer comprises a PSG layer.

The diode comprises a vertical PN diode which includes a stack structure of an N region and a P region.

A junction surface between the N region and the P region is located in the middle of the contact hole.

The diode comprises a silicon epi-layer.

In another aspect of the present invention, a method for manufacturing a phase change memory device comprises the steps of forming an insulation layer on a semiconductor substrate, the insulation layer being defined with a contact hole which has a CD that is greater at a middle portion thereof than an upper portion and a lower portion thereof; forming a diode in the contact hole; and forming a phase change memory cell on the diode.

Before the step of forming the insulation layer, the method further comprises the step of forming a conductivity type impurity region in a surface of the semiconductor substrate.

The step of forming the insulation layer having the contact hole comprises the steps of forming an insulation layer on the semiconductor substrate, the insulation layer having a triple-layered structure in which a second insulation layer having an etch rate higher than a first insulation layer and a third insulation layer is interposed between the first insulation layer and the third insulation layer; anisotropically etching the insulation layer having the triple-layered structure in such a way as to expose a portion of the semiconductor substrate; and isotropically etching the insulation layer which has been anisotropically etched so that the second insulation layer having the higher etch rate is etched more than the first and third insulation layers.

The first insulation layer and the third insulation layer comprise PE-TEOS layers, and the second insulation layer comprises a PSG layer.

The diode comprises a vertical PN diode.

The step of forming the diode comprises the steps of growing a silicon epi-layer in the contact hole; and forming a stack structure of an N region and a P region in the contact hole by conducting an ion implantation process for the silicon epi-layer.

A junction surface between the N region and the P region is formed to be located in the middle of the contact hole.

DESCRIPTION OF SPECIFIC EMBODIMENTS

Hereafter, specific embodiments of the present invention will be described in detail with reference to the accompanying drawings.

Figure 1:
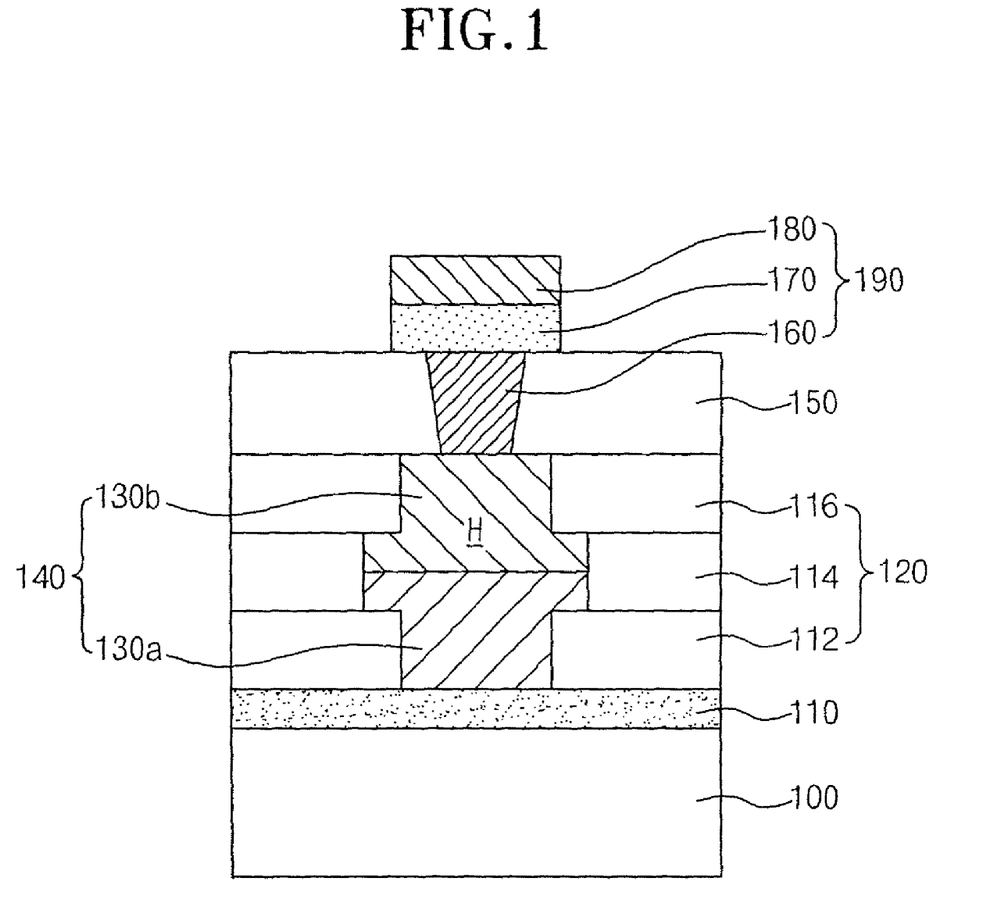
FIG. 1 is a sectional view illustrating a phase change memory device in accordance with an embodiment of the present invention.

FIG. 1 is a sectional view illustrating a phase change memory device in accordance with an embodiment of the present invention.

Referring to FIG. 1, a conductivity type impurity region 110 is formed in the surface of a semiconductor substrate 100. An insulation layer 120 having a contact hole H is formed on the semiconductor substrate 100 including the conductivity type impurity region 110. The insulation layer 120 has a triple-layered structure of a first insulation layer 112, a second insulation layer 114 and a third insulation layer 116. The second insulation layer 114 comprises a layer which has a higher etch rate than the first insulation layer 112 and the third insulation layer 116, for example, a PSG (phosphosilicate glass) layer. The first insulation layer 112 and the third insulation layer 116 comprise layers which have a lower etch rate than the second insulation layer 114, for example, PE-TEOS (plasma enhanced-tetra ethyl ortho silicate) layers. Also, the contact hole H has a CD that is greater at the middle portion thereof than the upper portion and the lower portion thereof.

A vertical PN diode 140 having a stack structure of an N region 130a and a P region 130b is formed in the contact hole H. The vertical PN diode 140 contacts the conductivity type impurity region 110. Further, the vertical PN diode 140 comprises a silicon epi-layer, and a junction surface between the N region 130a and the P region 130b is located in the middle of the contact hole H.

A phase change memory cell 190, which includes a bottom electrode 160, a phase change layer 170 and a top electrode 180, is formed on the vertical PN diode 140. It is understood that additional electrical contacts (not shown) can be respectively formed between the bottom electrode 160 and the phase change layer 170 and between the phase change layer 170 and the top electrode 180.

FIG. 1 shows the interlayer dielectric 150 on the insulation layer 120.

In the phase change memory device according to the embodiment of the present invention, the vertical PN diode 140 is formed in the contact hole H having a CD (critical dimension) that is greater at the middle portion than at either the upper or lower portions of the vertical PN diode 140. As a result, the junction surface between the N region 130a and the P region 130b of the vertical PN diode 140 is located in the CD of the vertical PN diode 140, i.e., the middle of the contact hole H.

Accordingly, in the present invention, as the interfacial area of the vertical PN diode 140 is increased, the current drivability of the phase change memory device can be increased and hence enhanced. Whereby the characteristics of the vertical PN diode 140 having a wide CD provides an improved performance and reliability of the resultant device.

Also, in the present invention, since the vertical PN diode 140 has a greater CD only at the middle portion thereof, the cross sectional area of the upper surface of the vertical PN diode 140 does not increase. By doing this, the present invention avoids the occurrence of a bridge phenomenon.

FIGS. 2A through 2H are sectional views illustrating the processes of a method for manufacturing a phase change memory device in accordance with another embodiment of the present invention. The method will be described below.

Figure 2A:
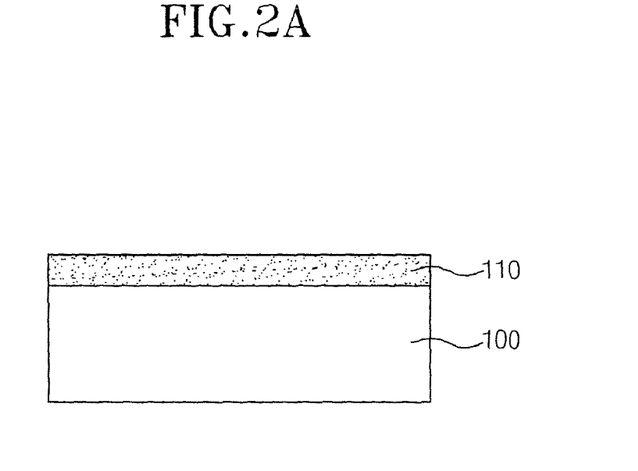
FIGS. 2A through 2H are sectional views illustrating the processes of a method for manufacturing a phase change memory device in accordance with another embodiment of the present invention.

Referring to FIG. 2A, a conductivity type impurity region 110 is formed by ion-implanting conductivity type impurities, for example, N-type impurities into the surface of a semiconductor substrate 100. The conductivity type impurity region 110 serves as a wiring line that electrically connects a vertical PN diode and a word line contact plug which will be subsequently formed.

Figure 2B:
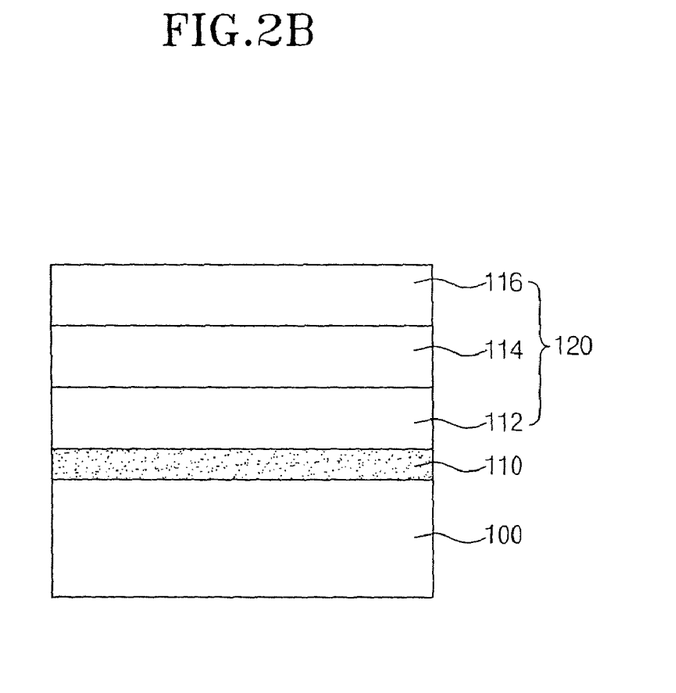

Referring to FIG. 2B, an insulation layer 120 comprising a triple-layered stacked structure composed of a first insulation layer 112, a second insulation layer 114 and a third insulation layer 116 is formed on the conductivity type impurity region 110 of the semiconductor substrate 100. The second insulation layer 114 exhibits a higher etch rate than that of the first insulation layer 112 and the third insulation layer 116. The second insulation layer 114 can, for example, can be composed of a PSG (phosphosilicate glass) layer. As stated above, the first insulation layer 112 and the third insulation layer 116 comprise layers that exhibit lower etch rates than the second insulation layer 114, and can be composed of, for example, PE-TEOS (plasma enhanced-tetra ethyl ortho silicate) layers.

Figure 2C:
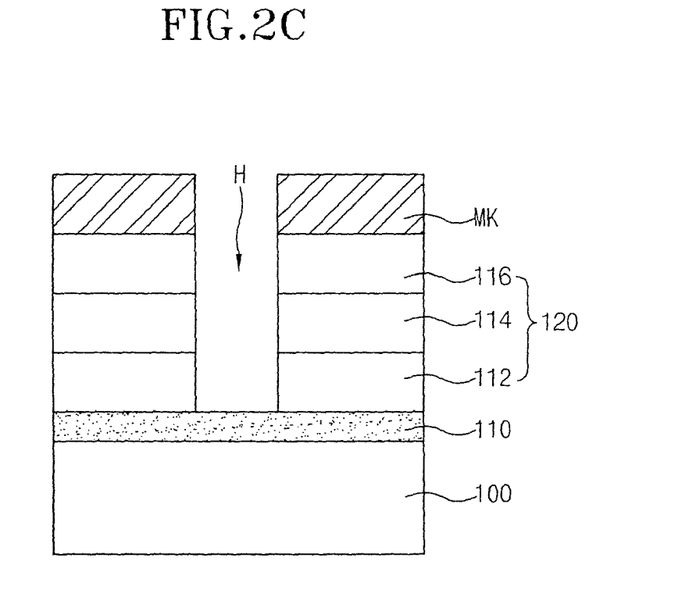

Referring to FIG. 2C, a mask pattern MK is formed on the insulation layer 120 in such a way as to expose a contact hole is defining region. By anisotropically etching the insulation layer 120 comprising the triple-layered structure of the first through third insulation layers 112, 114 and 116 using the mask pattern MK as an etch mask, a contact hole H is defined which exposes the conductivity type impurity region 110 of the semiconductor substrate 100. The anisotropic etching can be conducted in a dry type manner.

Figure 2D:
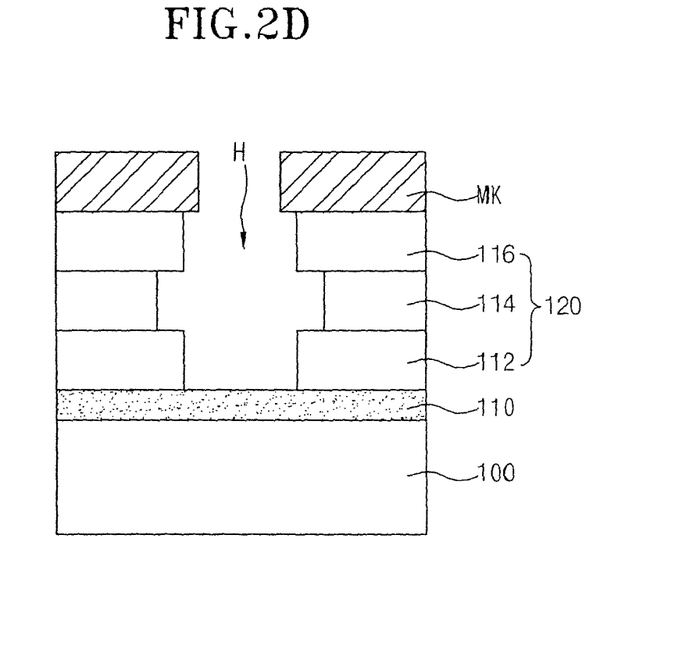

Referring to FIG. 2D, by isotropically etching the insulation layer 120 which has been anisotropically etched, the CD of the contact hole H is increased at the middle portion thereof when compared to the upper portion and the lower portion thereof. The isotropic etching can be conducted in a wet type manner. By doing this, since the etch rate of the second insulation layer 114 is higher than that of first and third insulation layers 112 and 116, then the second insulation layer 114 is etched more than the first and third insulation layers 112 and 116. As a consequence, in the present invention, the CD of the contact hole H can be selectively increased only at the middle portion thereof.

Figure 2E:
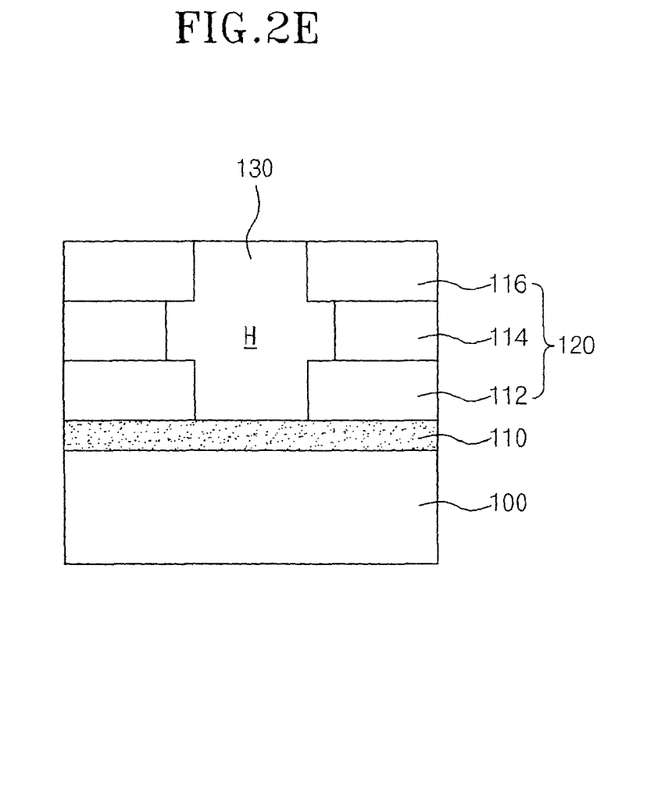

Referring to FIG. 2E, a silicon epi-layer 130 is then grown in the contact hole H, for example, by using a SEG (selective epitaxial growth) process. Then, the silicon epi-layer 130 is CMPed (chemically and mechanically polished) or etched back until the third insulation layer 116 of the insulation layer 120 is exposed.

Figure 2F:
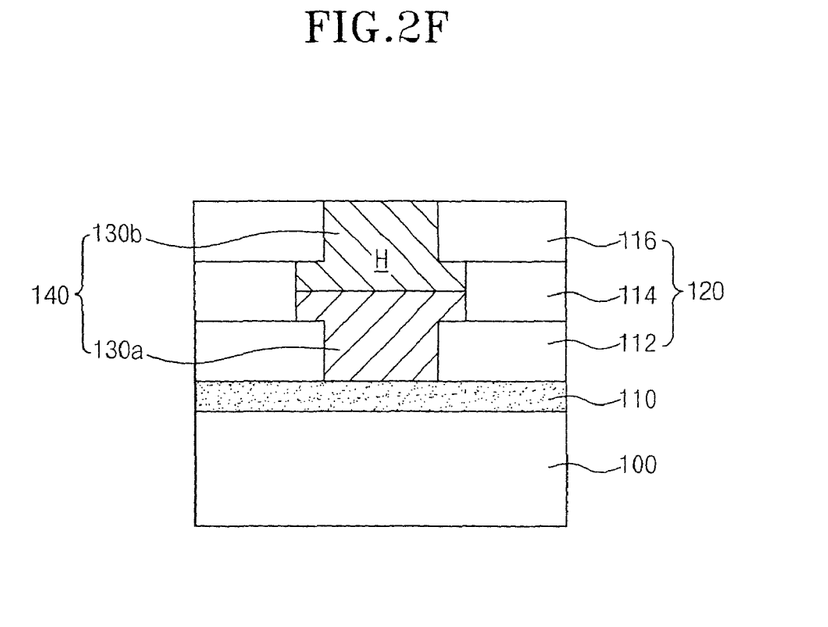

Referring to FIG. 2F, by conducting N-type and P-type impurity ion implantation processes for the silicon epi-layer 130, a vertical PN diode 140, which comprises the stack structure of an N region 130a and a P region 130b and contacts the conductivity type impurity region 110, is formed in the contact hole H. The junction surface between the N region 130a and the P region 130b of the vertical PN diode 140 is intentionally located in the middle of the contact hole H which has the greater CD than the upper portion and the lower portion of the contact hole H.

Figure 2G:
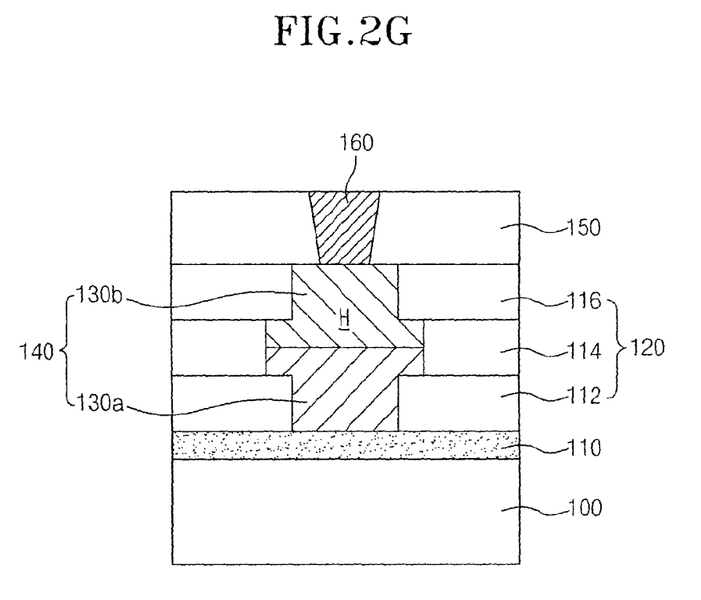

Referring to FIG. 2G, after forming an interlayer dielectric 150 on the vertical PN diode 140 and on the insulation layer 120, and by selectively etching the interlayer dielectric 150, a hole is defined that exposes the vertical PN diode 140. A bottom electrode 160 is then formed in the hole to electrically contact the vertical PN diode 140.

Figure 2H:
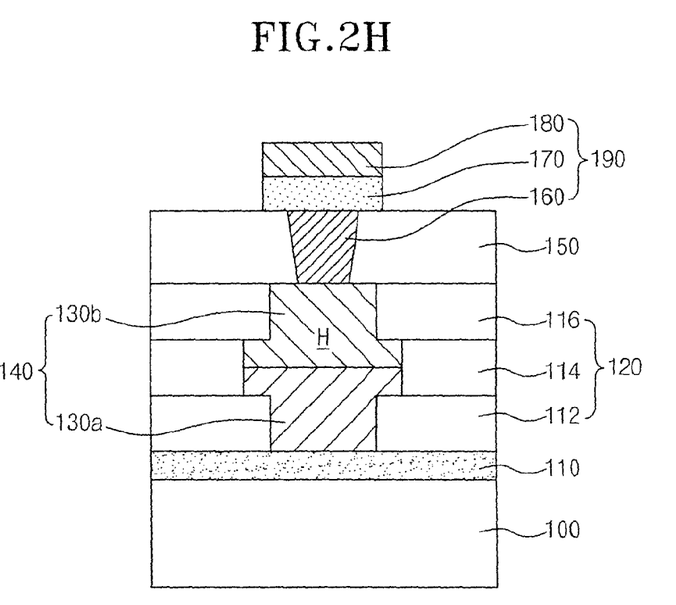

Referring to FIG. 2H, a phase change layer 170 and a conductive layer 180 which serves as a top electrode 180 are formed on top of the bottom electrode 160 in the interlayer dielectric 150. Next, by patterning the conductive layer for a top electrode and the phase change layer 170, a phase change memory cell 190, which includes the bottom electrode 160, the phase change layer 170 and a top electrode 180, is formed on the vertical PN diode 140. It is understood that additional electrical contacts (not shown) can be respectively formed between the bottom electrode 160 and the phase change layer 170 and between the is phase change layer 170 and the top electrode 180.

Thereafter, while not shown in a drawing, by sequentially conducting a series of well-known subsequent processes, the manufacture of a phase change memory device according to the embodiment of the present invention is completed.

As is apparent from the above description, in the embodiment of the present invention, an insulation layer having a triple-layered structure, in which an insulation layer having a relatively high etch rate is inserted, is formed, and a wet etching process is conducted such that the insulation layer having the relatively high etch rate is etched more. Due to this fact, it is possible to define a contact hole which has a CD that is greater at the middle portion than either the respective upper or lower portion.

As a consequence, in the present invention, by the fact that a vertical PN diode is formed in the contact hole which has the CD that is greater at the middle portion thereof than the upper portion and the lower portion thereof, the area of the middle portion of the vertical PN diode can be increased, and the current drivability of a phase change memory device can be improved. Through this, the characteristics and the reliability of the phase change memory device can be upgraded.

Further, in the present invention, the CD of the contact hole is not increased as a whole, and instead, only the CD of the middle portion of the contact hole is selectively increased. As a result, it is possible to increase the area of the vertical PN diode without increasing the CD of the upper surface of the vertical PN diode. Accordingly, the occurrence of a bridge phenomenon between adjoining diodes can be prevented.

In the above embodiment of the present invention, the second insulation layer that exhibits an etch rate higher than first and third insulation layers is interposed between the first and third insulation layers, and the CD of the middle portion of the contact hole is increased by using an isotropic etching process, such as a wet etching process, in which the second insulation layer is etched more than the first and third insulation layers. However, in another embodiment of the present invention, a contact hole having a CD that is greater at the middle portion thereof than the upper portion and the lower portion thereof can be defined by appropriately changing the conditions of an etching process for defining the contact hole.

Figure 3:
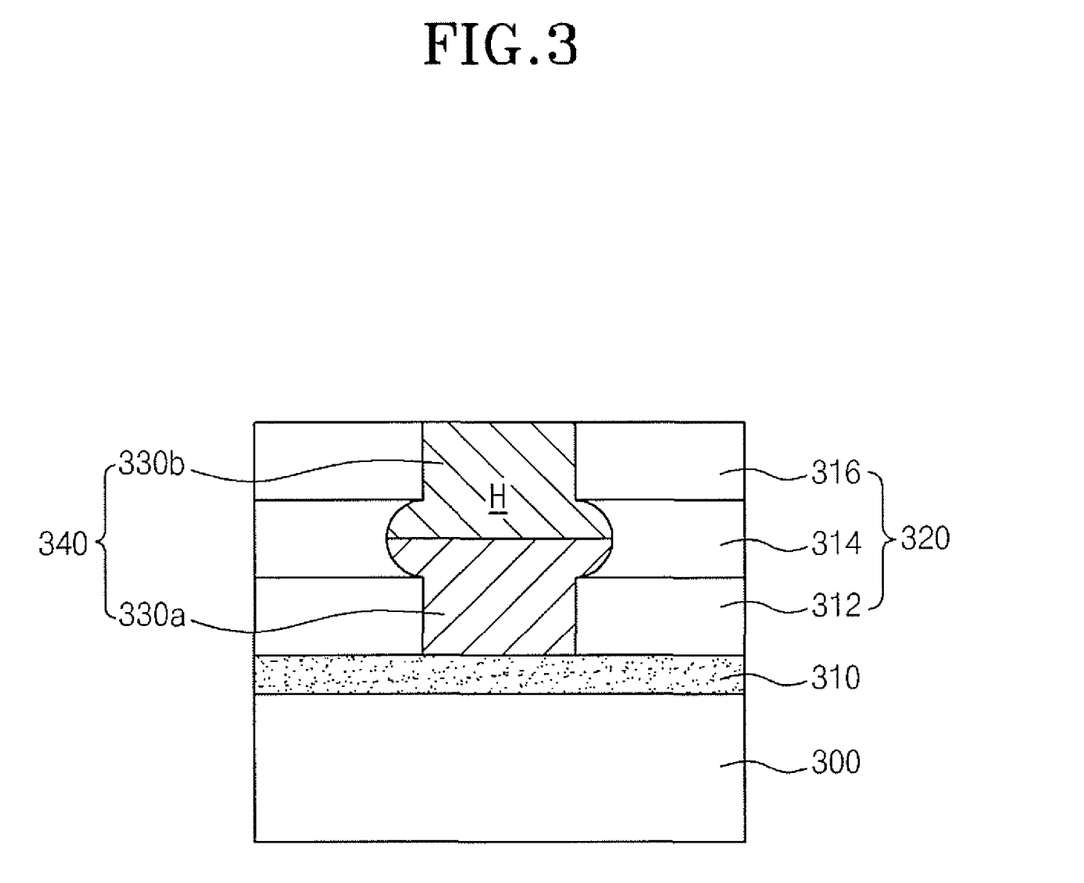
FIG. 3 is a sectional view illustrating a vertical PN diode of a phase change memory device in accordance with still another embodiment of the present invention.

FIG. 3 is a sectional view illustrating a vertical PN diode of a phase change memory device in accordance with still another embodiment of the present invention.

Referring to FIG. 3, a conductivity type impurity region 310 is formed in the surface of a semiconductor substrate 300. Then an insulation layer 320 having a contact hole H which has a CD that is greater at the middle portion than the respective upper and lower portions is formed on the conductivity type impurity region 310 of the semiconductor substrate 300. Afterwards, a vertical PN diode 340 which comprises the stack structure of an N region 330a and a P region 330b is formed in the contact hole H.

The vertical PN diode 340 electrically contacts the conductivity type impurity region 310. The vertical PN diode 340 comprises a silicon epi-layer, and the junction surface between the N region 330a and the P region 330b of the vertical PN diode 340 is located in the middle of the contact hole H.

In another embodiment of the present invention, when conducting an etching process for defining the contact hole H or conducting a cleaning process after defining the contact hole H, by appropriately changing process conditions so that the middle portion of the insulation layer 120 is etched more, it is possible to define the contact hole H that has a CD which is greater at the middle portion than the respective upper and lower. Accordingly, the contact hole H can bulge laterally outward at the middle portion thereof.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
   a semiconductor substrate;
   an insulation layer placed on the semiconductor substrate and having a contact hole in which the contact hole has a CD (critical dimension) that is greater at a middle portion than at respective upper and lower portions of the contact hole;
   a diode formed within the contact hole; and
   a phase change memory cell formed on the diode wherein the diode comprises a vertical PN diode which includes a P region stacked on top of an N region and wherein a junction surface between the N region and the P region is located in the middle of the contact hole.

2. The phase change memory device according to claim 1, further comprising a conductivity type impurity region formed in a surface of the semiconductor substrate and electrically contacts to the diode.

3. The phase change memory device according to claim 1, wherein the insulation layer has a triple-layered stacked structure comprising a first insulation layer, a second insulation layer, and a third insulation layer.

4. The phase change memory device according to claim 3, wherein the second insulation layer comprises a layer which exhibits an isotropic etch rate higher than that of the first and third insulation layers of the insulation layer.

5. The phase change memory device according to claim 3, wherein the first and third insulation layers comprise PE-TEOS (plasma enhanced tetra ethyl ortho silicate) layers, and the second insulation layer comprises a PSG (phosphosilicate glass) layer.

6. The phase change memory device according to claim 1, wherein the diode comprises a silicon epi-layer.

7. A method for manufacturing a phase change memory device, comprising the steps of:

forming an insulation layer on a semiconductor substrate, the insulation layer defining a contact hole which has a CD (critical dimension) that is greater at a middle portion than at either an upper or a lower portion and a lower portion of the contact hole;

forming a diode within the contact hole wherein the step of forming the diode comprises the steps of: forming a stack structure of an N region and a P region in the contact hole wherein a junction surface between the N region and the P region is located in the middle of the contact hole; and forming a phase change memory cell on the diode.

8. The method according to claim 7, further comprises the step of forming a conductivity type impurity region in a surface of the semiconductor substrate before the step of forming the insulation layer.

9. The method according to claim 7, wherein the step of forming the insulation layer having the contact hole comprises the steps of:

forming the insulation layer on the semiconductor substrate, the insulation layer having a triple-layered structure composed of a first, second, and third insulation layers in which the second insulation layer exhibits an isotropic etch rate greater than that of the first and third insulation layers;

anisotropically etching the insulation layer to expose a portion of the semiconductor substrate; and isotropically etching the insulation layer which has been anisotropically etched so that the second insulation layer is etched more than the first and third insulation layers.

10. The method according to claim 9, wherein the first insulation layer and the third insulation layer comprise PE-TEOS (plasma enhanced tetra ethyl ortho silicate) layers, and the second insulation layer comprises a PSG (phosphosilicate glass) layer.

11. The method according to claim 7, wherein the diode is a vertical PN diode.

12. The method according to claim 7, wherein the step of forming the diode comprises the steps of: growing a silicon epi-layer within the contact hole; and forming the stack structure by conducting multiple ion implantation processes onto the silicon epi-layer within the contact hole.

* * * * *